(12) United States Patent
Pelletier et al.

(10) Patent No.: US 10,811,279 B2
(45) Date of Patent: Oct. 20, 2020

(54) FLIP-CHIP HIGH SPEED COMPONENTS WITH UNDERFILL

(71) Applicant: Ciena Corporation, Hanover, MD (US)

(72) Inventors: Francois Pelletier, St. Augustin (CA); Michael Vitic, Chelsea (CA)

(73) Assignee: Ciena Corporation, Hanover, MD (US)

( * ) Notice: Subject to any disclaimer, the term of this patent is extended or adjusted under 35 U.S.C. 154(b) by 24 days.

(21) Appl. No.: 15/689,026

(22) Filed: Aug. 29, 2017

(65) Prior Publication Data

US 2019/0067037 A1 Feb. 28, 2019

(51) Int. Cl.
*H01L 23/28* (2006.01)
*H01L 21/56* (2006.01)
*H01L 23/00* (2006.01)

(52) U.S. Cl.
CPC ............ *H01L 21/563* (2013.01); *H01L 24/12* (2013.01); *H01L 24/17* (2013.01); *H01L 24/13* (2013.01); *H01L 24/16* (2013.01); *H01L 2224/131* (2013.01); *H01L 2224/13144* (2013.01); *H01L 2224/13147* (2013.01); *H01L 2224/165* (2013.01); *H01L 2224/16227* (2013.01); *H01L 2224/26145* (2013.01); *H01L 2224/26175* (2013.01); *H01L 2224/32225* (2013.01); *H01L 2224/73204* (2013.01); *H01L 2224/92125* (2013.01); *H01L 2924/01029* (2013.01); *H01L 2924/01079* (2013.01); *H01L 2924/1068* (2013.01); *H01L 2924/10253* (2013.01); *H01L 2924/10271* (2013.01); *H01L 2924/10329* (2013.01); *H01L 2924/10335* (2013.01); *H01L 2924/10337* (2013.01); *H01L 2924/10342* (2013.01); *H01L 2924/1421* (2013.01); *H01L 2924/15159* (2013.01); *H01L 2924/30105* (2013.01); *H01L 2924/351* (2013.01)

(58) Field of Classification Search
CPC ....... H01L 21/563; H01L 24/12; H01L 24/17; H01L 2224/165; H01L 2924/01029; H01L 2924/01079; H01L 2224/26; H01L 2224/26145; H01L 2224/26175; H01L 2225/06513
USPC .......................................... 257/787, 778, 783
See application file for complete search history.

(56) References Cited

U.S. PATENT DOCUMENTS

| | | | | |
|---|---|---|---|---|
| 4,604,644 A * | 8/1986 | Beckham | ............... | H01L 21/563 228/175 |
| 5,203,076 A * | 4/1993 | Banerji | .................. | H01L 21/563 174/260 |
| 5,710,071 A * | 1/1998 | Beddingfield | ........ | H01L 21/563 257/778 |
| 5,808,878 A * | 9/1998 | Saito | ..................... | H01L 23/552 257/659 |
| 5,883,430 A * | 3/1999 | Johnson | ............... | H01L 23/3128 257/706 |
| 5,969,461 A * | 10/1999 | Anderson | ............... | H01L 24/32 174/260 |
| 6,388,336 B1 * | 5/2002 | Venkateshwaran | ........................ | H01L 23/4951 257/666 |

(Continued)

*Primary Examiner* — Nitin Parekh

(74) *Attorney, Agent, or Firm* — Clements Bernard Walker; Lawrence A. Baratta, Jr.; Christopher L. Bernard

(57) ABSTRACT

A flip-chip manufacture is described. Methods of blocking adhesive underfill in flip-chip high speed component manufacture include creating topology discontinuities to prevent adhesive underfill material from interacting with RF sensitive regions on substrates.

19 Claims, 7 Drawing Sheets

(56) References Cited

U.S. PATENT DOCUMENTS

| | | | |
|---|---|---|---|
| 6,476,502 B2 * | 11/2002 | Yamada | H01L 25/0652 |
| | | | 257/723 |
| 6,507,107 B2 * | 1/2003 | Vaiyapuri | H01L 21/563 |
| | | | 257/723 |
| 6,599,774 B2 * | 7/2003 | Hultmark | H01L 21/563 |
| | | | 257/E21.503 |
| 6,836,007 B2 * | 12/2004 | Michii | H01L 23/3114 |
| | | | 257/207 |
| 6,907,151 B2 * | 6/2005 | Yunus | G02B 6/4214 |
| | | | 385/14 |
| 8,399,300 B2 * | 3/2013 | Lee | H01L 21/50 |
| | | | 438/118 |
| 2009/0230566 A1 | 9/2009 | Hisada et al. | |
| 2011/0133321 A1 * | 6/2011 | Ihara | H01L 24/33 |
| | | | 257/676 |
| 2011/0260338 A1 * | 10/2011 | Lee | H01L 23/13 |
| | | | 257/778 |

* cited by examiner

FLIP-CHIP HIGH SPEED COMPONENTS WITH UNDERFILL

TECHNICAL FIELD

The proposed solution relates to flip-chip chip level manufacture, and in particular to selectively blocking underfill in high operational speed flip-chip component manufacture.

BACKGROUND

For example, silicon photonics is a technology which employs waveguides wafer level manufactured on a Silicon on Insulator (SOI) wafer. FIG. 1 illustrates an SOI wafer 100. The waveguides can be very narrow and are typically manufactured in an active region 102, which in one example a waveguide can be 50×5000 um. In one example, four such waveguides form a modulator. At a 500 to 650 um pitch, such a modulator would use an area of about 1250×5000 um. The active region 102 could in fact be quite large in overall size, e.g. 5×7 mm, especially when crosstalk needs to be mitigated. Silicon photonics technology enables the fabrication of high operational speed modulators based on a conversion of electrical data signals into modulated light. It also allows the conversion of optical light signals into electrical signals from DC up to very high frequency Radio Frequency (RF) which is useful in providing photodetectors and demodulation, for example for telecommunications applications.

There is a need in high operational speed applications to assemble the silicon photonics chip 100 in a 'flip-chip' configuration as illustrated in FIG. 2A in which the silicon photonics chip 100 is flipped and connected downward (with respect to the orientation of the figures herein) towards a connection substrate 200 (interconnect/interposer) which is itself manufactured typically employing a different technology, for example CMOS, organic multilayer, single and multilayer Low Temperature Co-fired Ceramic (LTCC) or High Temperature Co-fired Ceramic (HTCC). Components having such configuration normally include multiple connections 180 acting as electrical and mechanical contacts between the silicon photonics chip 100 and the substrate 200. Providing electrical contacts provides overall component functionality, while providing mechanical contacts (anchors) ensures overall flip-chip component integrity. While solder balls 180 are described and illustrated herein to provide the connections, it would be understood that such connectivity can equally be provided by gold stud bumps or copper pillars, and pads (not shown).

From the mechanical integrity perspective of the overall flip-chip component illustrated in FIG. 2A, one approach to address mechanical stress between physically dissimilar photonic IC chip 100 and substrate 200 is to select and employ a substrate 200 having a Coefficient of Thermal Expansion (CTE) perfectly matched to the CTE of the photonic IC chip 100 for manufacturing the overall flip-chip component. To be matched in CTE with the silicon photonics chip 100, the CTE of the wafer substrate 200 must be very low around 3-4 ppm/° C. compared to the typical 12-15 ppm/° C. of generic substrates 200. When employed, this solution may mitigate the flip-chip mechanical stress between the silicon photonics chip 100 and the wafer substrate 200, but only transfers the mechanical stress problem to a second interface (not shown) between the wafer substrate 200 and a PCB (not shown). Employing Ball Grid Array (BGA) bonding to the PCB, such a joint may not be reliable enough for telecommunications applications, as the joint will fall below the industry standard requirements for such components. Notably, low CTE substrates 200 are also very expensive and limited from a design capabilities perspective.

In another approach an adhesive underfill material, such as epoxy, is employed between the silicon photonic chip 100 and the wafer substrate 200 to increase the mechanical reliability of the joint by redistributing the mechanical anchoring/attachment forces concentrated at the solder balls 180 themselves to also include the adjacent area around the solder balls 180. The use of underfill is the best suited method in the industry to enhance solder ball connectivity reliability while allowing the use of dissimilar CTE materials in the flip-chip component with the silicon photonics chip 100. FIG. 2B illustrates the flip-chip structure of FIG. 2A to which an underfill adhesive 150 material in fluid form is applied on edge, for example via a dispensing nozzle 152. Capillary action between the wafer 100 and substrate 200 draws in the fluid underfill adhesive material 150 as illustrated in FIG. 2C; subsequently the fluid underfill material 150 is cured.

The state of the art in underfill adhesive 150 injection can be summarized by attempts described in US 2009/0230566 to provide full adhesive 150 underfill distribution (as illustrated in FIG. 2C herein). In accordance with such current attempts, underfill adhesive 150 properties are selected which permit the adhesive material to be dispensed through a fine tip, diffused between the solder balls 180 without creating cavities, and cured without creating cavities as shown in FIG. 2C herein. In particular, US 2009/02305666 describes employing vias (not shown herein) to create suction forces to eliminate underfill adhesive cavities in flip-chip components.

SUMMARY

In accordance with an aspect of the proposed solution there is provided a flip-chip structure utilizing two adjacent layers, the flip-chip structure comprising: at least one topology discontinuity formed, on at least one of a pair of opposed surfaces of the two adjacent layers, outside at least one sensitive region of the flip-chip structure; and adhesive underfill material, between the pair of opposed surfaces, substantially outside the at least one sensitive region to create a substantially adhesive underfill material-free region.

In accordance with another aspect of the proposed solution there is provided a method of manufacturing a flip-chip structure having two adjacent layers and at least one sensitive region on at least one of a pair of opposed surfaces of the two adjacent layers, the method comprising: forming at least one topology discontinuity on at least one of the opposed surfaces outside the sensitive region; dispensing underfill material between the pair of opposed surfaces, the topology discontinuity serving to substantially limit the flow of adhesive underfill material into the sensitive region and to thus create a substantially adhesive underfill material-free region; and curing the adhesive underfill material.

BRIEF DESCRIPTION OF THE DRAWINGS

The proposed solution will be better understood by way of the following detailed description of embodiments of the invention with reference to the appended drawings, in which.

DETAILED DESCRIPTION

Figure 1:
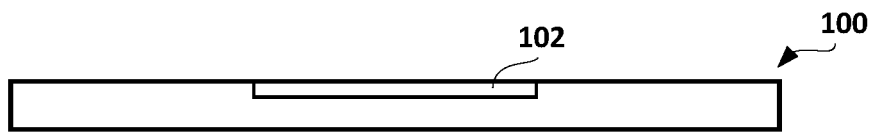
FIG. 1 is a schematic diagram showing a typical Silicon on Insulator (SOI) wafer including waveguides in accordance with the proposed solution.
Figure 2A:
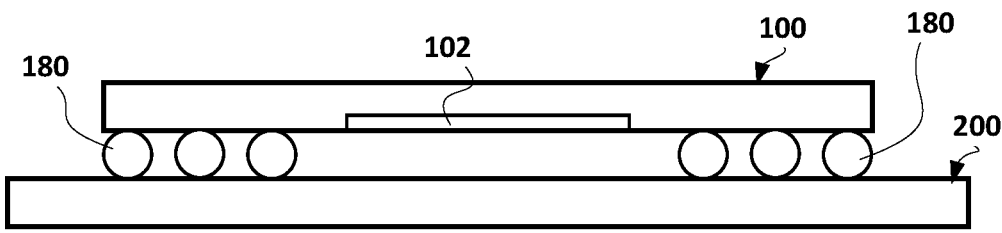
FIG. 2A is schematic diagram showing a prior art flip-chip connectivity between an SOI wafer and a generic wafer level manufactured substrate.
Figure 2B:
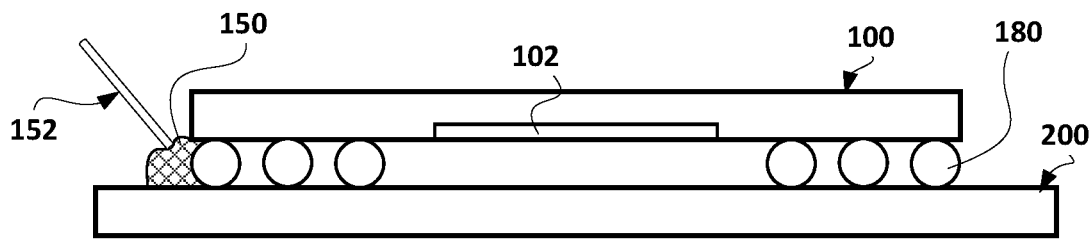
FIG. 2B is a schematic diagram showing prior art dispensing of underfill material between the SOI wafer and the generic substrate.
Figure 2C:
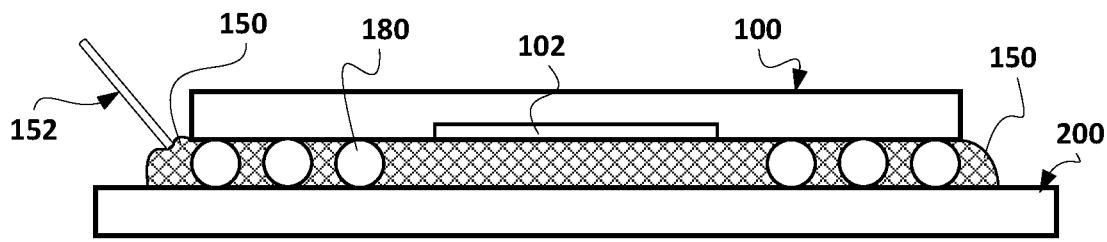
FIG. 2C is another schematic diagram showing prior art full underfill adhesive distribution in manufacturing a flip-chip component.

Major problems have been discovered with employing "full" underfill as illustrated in FIG. 2C in that the underfill adhesive material 150 interacts electrically with the high speed electrical circuits 102 on the silicon photonics chip 100. For example, electrical signals in modulator waveguides are very sensitive to the surrounding physical environment around the electrical traces on the wafer 100 as the electrical signals are not physically confined to the silicon photonics circuit. In typical applications, the electromagnetic field of the electrical signals extends from a few microns up to a few millimeters beyond the chip (wafer) surface and physical materials (layers, substrates, fillers, etc.) in the vicinity of the waveguides contribute with their physical/electrical properties to affect signals in the waveguides. For example, physical properties of such additional materials contribute parasitic capacitances, parasitic resistances, parasitic inductances, and/or parasitic impedances to electrical signals in the waveguides in the active region 102 of the silicon photonics integrated circuit (IC) chip 100. At least in these ways, the underfill adhesive material 150 interacts electrically with the sensitive high speed circuits 102 most notably through the dielectric constant and loss tangent of the underfill adhesive material 150 which influences the behavior of the electrical fields, resulting in high RF losses. An additional effect is that the adjacent presence of underfill material 150 can provide a signal path that increases crosstalk between silicon photonic chip (100) waveguides of the devices integrated therein such as between modulators or between modulator (transmitter) and the photodetector (receiver). Both of the above noted signal loss effects impact overall flip-chip component performance and are not desirable.

Flip-chip High Speed Silicon Photonics Circuits (HSPC) are rather new in the industry and these problems have not been addressed. There is a need to address these outstanding issues.

The issue of underfill material 150 interacting with high speed RF ICs 102 will become a serious hurdle for designers as these problems must be resolved in order to have efficient and reliable opto-electronic functions implemented in HSPC. For certainty, while extensive reference has and will be made herein to a silicon photonics chip 100, the invention is not limited thereto: all concepts described herein could apply to other high operational speed photonics integrated circuits employing other technology platforms such as, but not limited to: CMOS, SiGE, Indium phosphide, Lithium Niobate, Planar Lightwave Circuit (PLC), InGaAs, GaAs and GaAsP substrate, etc. to achieve the similar benefits and results.

The present proposed solution attempts to correct signal distortion in high speed flip-chip RF components by providing flip-chip processes which provide retention means to stop the underfill material from interacting with sensitive regions 102 of the chip 100. In accordance with the proposed solution the adhesive underfill material is effectively blocked from being dispensed under the active regions 102 of the HSPC that contains the sensitive high frequency structures, while being dispensed to provide mechanical protection for the solder balls 180. The solder balls 180 are prevented from shearing off for example due to CTE mismatch.

As another example, GaAs Traveling Wave Amplifiers (TWA) as integrated chip components in an HSPC are extremely sensitive to the presence of any dielectric material on top of the transistors and/or transmission lines of the TWAs, and hence can only employ thin dielectrics (or passivation layers) on top of sensitive region 102. Chips including such TWAs are otherwise precluded from being flip chipped using conventional underfill adhesive injection/diffusion techniques. Any other RF IC device (T-section, Mach-Zehnder Modulator, passive devices such as antennae, inductors, RF couplers/combiners, transmission lines, terminations etc.) which is sensitive to RF distortions when flip chipped would benefit from reducing signal distortion.

In accordance with the proposed solution, a subcombination of several flip-chip manufacturing processes proposed herein can be employed to provide underfill adhesive retention outside the sensitive IC region 102 on the silicon photonics chip 100 to prevent the underfill adhesive material from interacting with the sensitive region 102 and from interacting with the electrical paths therein. The terms "active region 102" and "sensitive region 102" will be used interchangeably, sensitive regions include active regions as described hereinabove. As will be described hereinbelow other sensitive regions need not be active in the sense that RF waveguides are present.

The general operating principle to selectively block the underfill adhesive material 150, otherwise generally desirable in providing mechanical contact in the electrical contact (solder ball) area, from flowing under a certain sensitive region 102 of the chip 100 is to create a topology discontinuity on flip-chip structures. An underfill material having a surface tension is employed such that the material meniscus of the underfill material will "snag" onto the topology discontinuity and not flow over the topology discontinuity to thus create an underfill adhesive material border. For certainty, the high surface tension underfill material employed to snag onto the discontinuity to create the underfill material border need not be the adhesive underfill material.

In accordance with the proposed solution, a topology discontinuity on at least one substrate is employed in the flip-chip manufacturing process. In the broader context, the topology discontinuity need not be continuous (for example using incomplete sputtering).

Figure 3A:
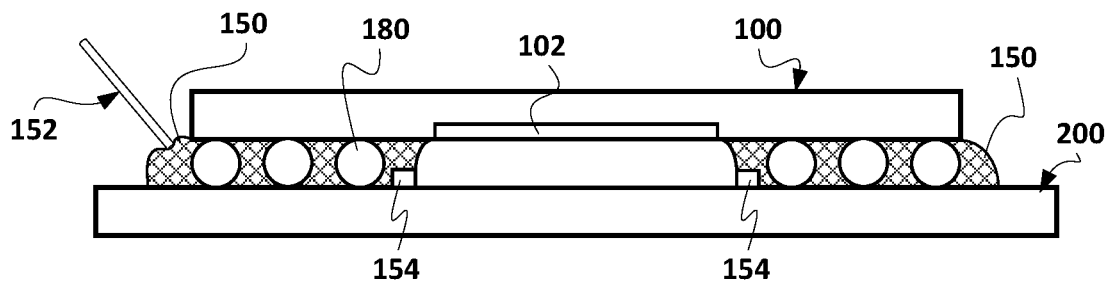
FIGS. 3A, 3B and 3C are schematic diagrams illustrating various implementations in accordance with a first embodiment of the proposed solution.

In accordance with one implementation of a first embodiment of the proposed solution illustrated in FIG. 3A, the topography discontinuity can be provided as a surface variation on the substrate 200 for example via a protruding barrier 154. Multiple techniques can be used to create the protruding barrier 154, for example wafer layer deposition, deposited wafer layer etch back, screen/stencil printing, 3D printing, etc. Such a protruding barrier 154 can disrupt and/or guide the flow of underfill material 150 outside the sensitive region 102. For example, underfill adhesive materials 150 having a high surface tension when dispensed 152 between the wafer 100 and substrate 200 by capillary action will form an inner meniscus which will snag on the protruding barrier 154 surface variation controllably impeding the flow of underfill adhesive material 150 under the sensitive circuit region 102 for providing the adhesive free region under the sensitive region 102. Another implementation illustrated in FIG. 3B includes a topology discontinuity in the form of a surface variation provided on the substrate 100 via protruding barrier 154 for providing the adhesive free region under the sensitive region 102. The choice as to which layer 100, 200 the barrier 154 is formed on can include barrier material 150 compatibilities with the outer layer material of the wafer 100/substrate 200, underfill material compatibilities, relative sizes of features, etc. The size of protruding barrier can depend on the properties of the underfill material.

In other implementations, the capillarity effect provided by the flip-chip structure 100/200 can be disrupted by relatively larger barriers 154, which with increased size relative to the separation between the wafer 100 and substrate 200, act as retaining walls which prevent flow of the underfill (adhesive) material 150. However, the extreme in which barriers of a size substantially equal (or greater) than the size of the solder balls 180 are not desired as such large barrier walls can act to affect spacing between the layers 100, 200 potentially affecting solder ball 180 electrical contact.

Figure 3B:
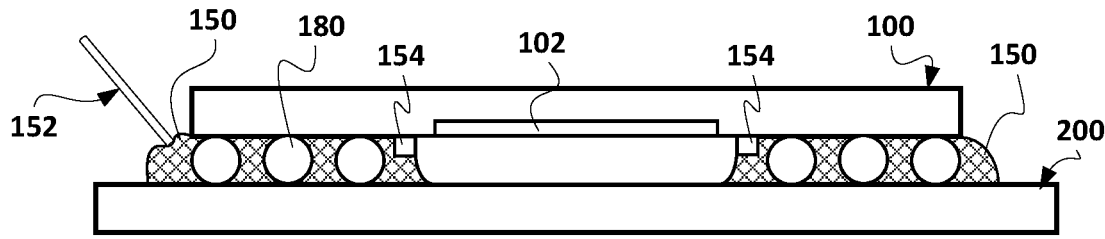

For certainty, the concavity of the inner underfill material meniscus illustrated in FIGS. 3A and 3B is not intended to limit the invention thereto. Wettability properties of the barrier 154 material, the wettability of the opposing surface 100/200, surface tension of the underfill (adhesive) material 150, and the viscosity of the underfill (adhesive) material 150 contribute to the inner meniscus being either a convex or a concave.

Figure 3C:
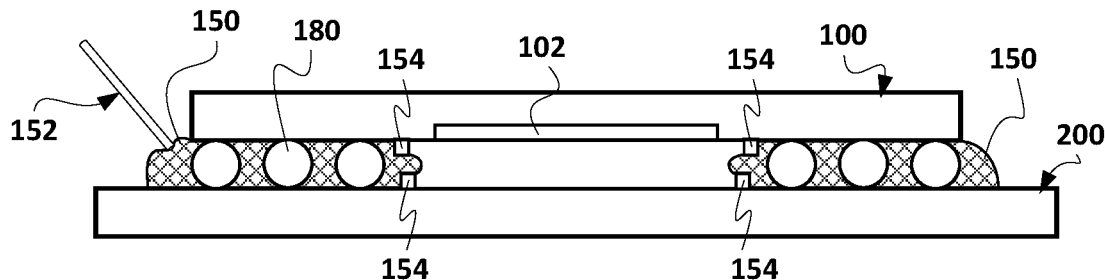

For example, FIG. 3C illustrates another implementation of the first embodiment of the proposed solution employing opposed barriers 154 on both the wafer 100 and substrate 200, not necessarily aligned vertically under (with respect to the orientation of the drawings herein) one another, with a convex underfill adhesive material 150 inner meniscus for providing the adhesive free region under the sensitive region 102.

The selection of the number of barriers 154, capillary action properties, underfill material viscosity, and surface tension properties of the underfill adhesive material 150 provide for taking into account some error tolerances in dispensing the underfill adhesive material 150. The inner meniscus (and the outer meniscus), between being concave and convex, can absorb some of the material dispensation error, wherein underfill adhesive material overspill is strongly undesired in the RF sensitive region 102 of the silicon photonics chip 100.

Material shrinkage of the underfill adhesive material 150, as it cures, must also be taken into account if any, favoring dispensing underfill adhesive material 150 with a slight convex meniscus if the material shrinkage factor is significant for the size of the flip-chip component. Adhesive underfill materials having excessive material shrinkage factors relative to the solder ball size are undesirable as such materials, despite reducing the possibility of contamination, can lead to excessive forces being applied to the solder balls 180 leading to solder ball displacement during curing and to loss of electrical contact.

Regardless of other desirable fluid flow and mechanical strength properties, underfill adhesive materials 150 which expand as they cure are least desired as such materials have a high chance to interfere detrimentally, and possibly expose the flip-chip components to separation of the layers 100/200 and loss of electrical contact at the solder balls 180.

As examples, the protruding barrier topology discontinuities 154 can be wafer level manufactured on the silicon photonics chip 100, for example, patterned metal Cu, Al, Au, Ni, etc. or oxides $SiO_2$, $Si_3N_4$, $Si_xNO_y$, Polyimide, polyamide, patternable polymer, epoxy, etc. can be deposited/sputtered to generate up to a few microns of protruding topography outside the desired regions to be protected. On the flip-chip substrate 200, multiple metals Cr, Ni, Pt, Pd, Au, Ti, TW, W, etc. or oxides $Al_2O_3$, AlN, $SiO_2$, etc. can be deposited by different techniques including, but not limited to: sputtering, evaporation, etch back, stencil printing, additive manufacturing, 3D printing, etc. Barriers 154 ranging from a few hundred nanometers up to tens of microns can be provided. Also, post-processed deposition of material can be further performed on the substrate 200. Examples of such post-processed deposition includes solder paste deposited and reflown on specific barrier shape metalization, arrays of gold ball bumps, etc.

For certainty, nothing in this disclosure limits the invention to the presence of the sensitive region 102 singly to the wafer 100, some embodiments employ sensitive regions 102 in either or both (registered or not) of wafer 100 and substrate 200.

Figure 4A:
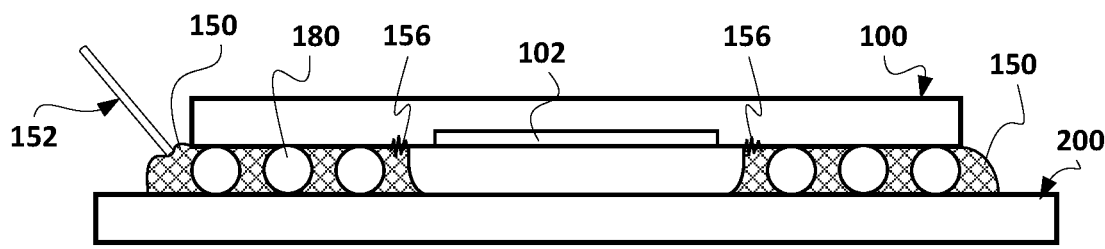
FIG. 4A is a schematic diagram illustrating, in a cross-sectional view, a second embodiment of the proposed solution.
Figure 4B:
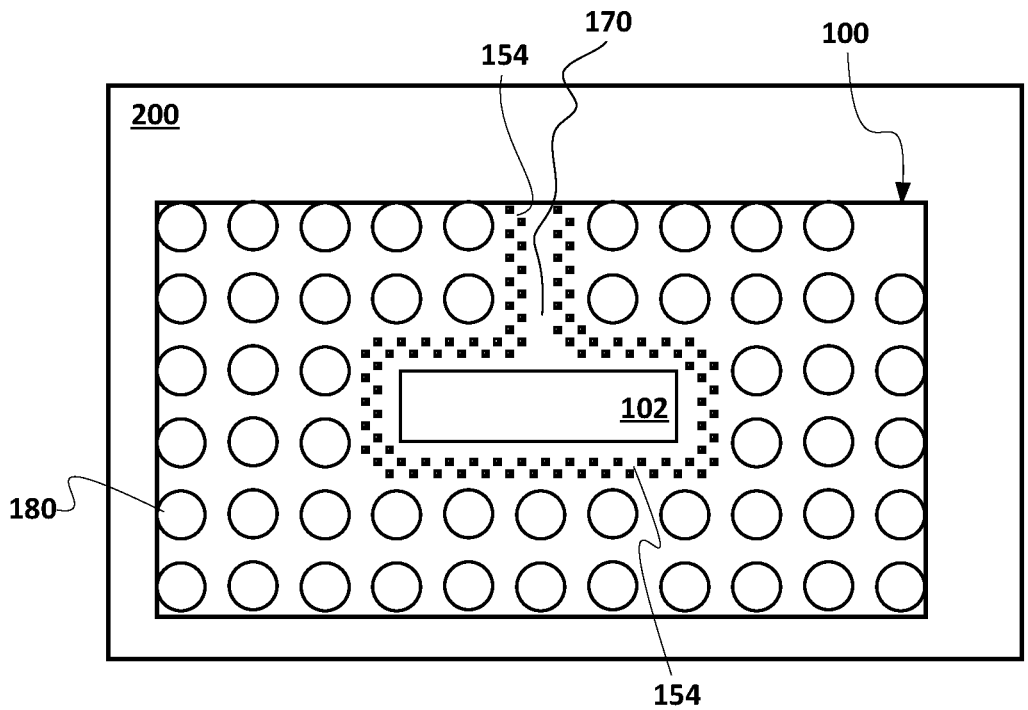
FIG. 4B is a schematic diagram illustrating, in a top plan view, a variation of the second embodiment of the proposed solution.

In accordance with a second embodiment of the proposed solution illustrated in FIG. 4A, the topology discontinuity includes a lower/thinner variant of the first embodiment, wherein the topology discontinuity includes surface roughness 156 employed to snag the inner meniscus of the (adhesive) underfill material 150. Such topology discontinuity, without limiting the invention, can be provided via incomplete sputtering, superficial surface etching, removing an oxide layer of a passivation layer, scribing etc. FIG. 4B illustrates a variant in which the surface roughness can be discontinuous/dotted/dashed however the distance between such surface roughness domains should be enough (dependent on the surface tension of the underfill material meniscus) to snag the underfill material meniscus without permitting overspill of underfill adhesive material 150 into the sensitive region 102. For example, half tone printing/etching techniques can be employed to provide controlled surface roughness. Again, this is not only dependent on the material properties of the underfill material 150 but also on the material properties of the etchant/sputtered material in combination with the design choices available with respect to the silicon photonics chip 100.

Figure 5A:
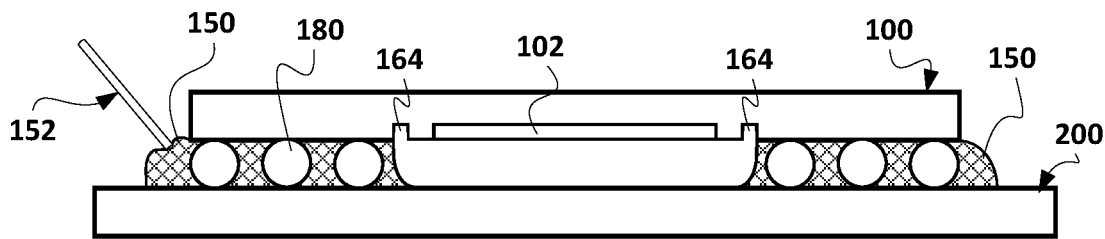
FIGS. 5A and 5B are schematic diagrams illustrating cavity barriers in accordance with other implementations of the first embodiment of the proposed solution.
Figure 5B:
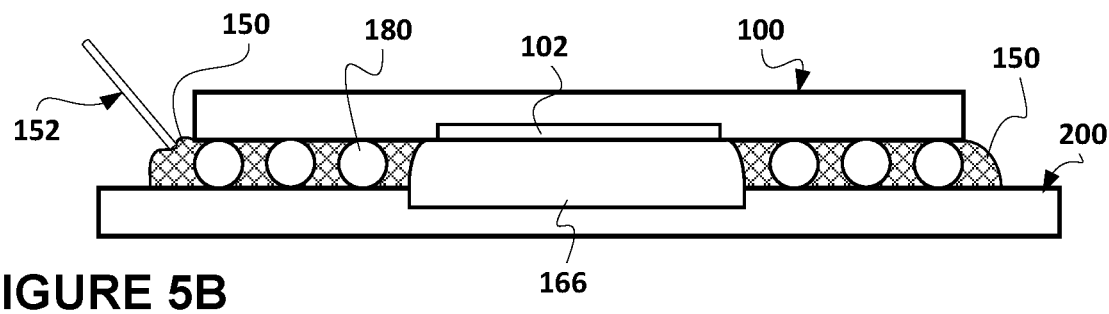

Returning to the first embodiment of the proposed solution wherein the topology discontinuity is a surface variation, other implementations forming the topology discontinuity include material removal. FIGS. 5A and 5B illustrate implementation examples wherein material removal from the wafer 100 is used to generate a trench 164 or generate a general depression 166 on the substrate 200. Such material removal can be provided by specific etching which can range from a few hundreds of nanometers up to a few hundred micrometers, for example using deep etching or KOH etching. In accordance with another implementation (not shown), a sufficient trench, for example in the substrate 200, can be provided by scribing lines outside the extents of the sensitive region 102. Again, such surface variation cavities are employed to snag the inner meniscus of the underfill (adhesive) material 150 to prevent the advance of the underfill adhesive material 150 under the sensitive region 102 of the silicon photonics chip 100. While a concave inner meniscus is illustrated in FIGS. 5A and 5B, the invention is not intended to be limited thereto, the shape of the meniscus being rather a function of the surface tension of the underfill (adhesive) material 150 and surface wettability of the substrate opposite the topology discontinuity as also noted earlier.

Figure 6A:
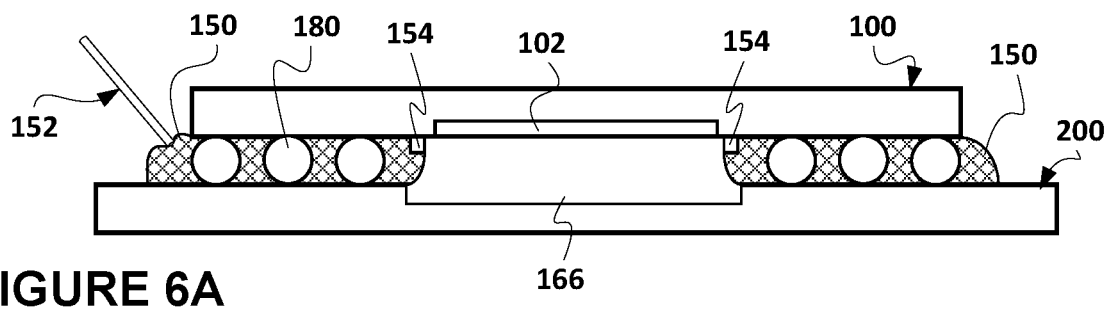
FIGS. 6A and 6B are schematic diagrams illustrating variants employing a mix of topology discontinuity barriers in accordance with other implementations of the first embodiment of the proposed solution.
Figure 6B:
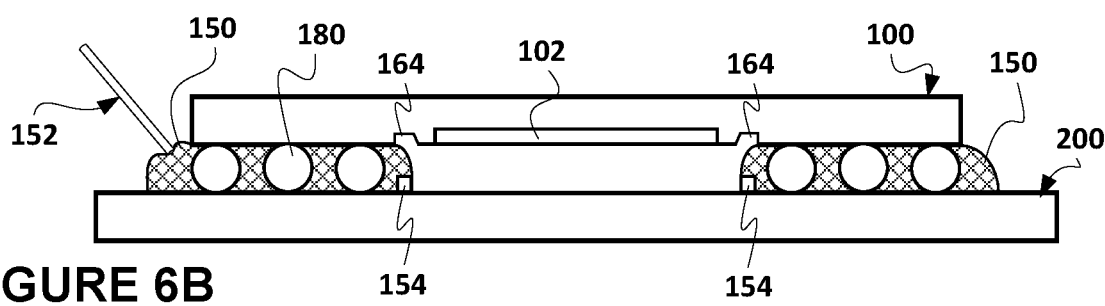

For certainty, employing a combination of topology discontinuities as illustrated in FIGS. 6A and 6B can provide greater flexibility in employing substrates 200 having dissimilar physical properties with respect to the silicon photonics chip 100 for providing the adhesive free region under the sensitive region 102. Without limiting the invention thereto, the inner meniscus of the adhesive underfill material 150 is illustrated as convex in FIGS. 6A and 6B. Again, the inner meniscus being concave or convex can also help mitigate errors in dispensation of the adhesive underfill material 150 through nozzle 152.

In accordance with the proposed solution, any of the above mentioned topology discontinuities, may be employed in combination with a vent to ensure that air pressure will not build up in the substantially adhesive free cavity between the flip-chip layers 100, 200 during temperature excursions either during manufacture/curing and/or during component operation.

Figure 7A:
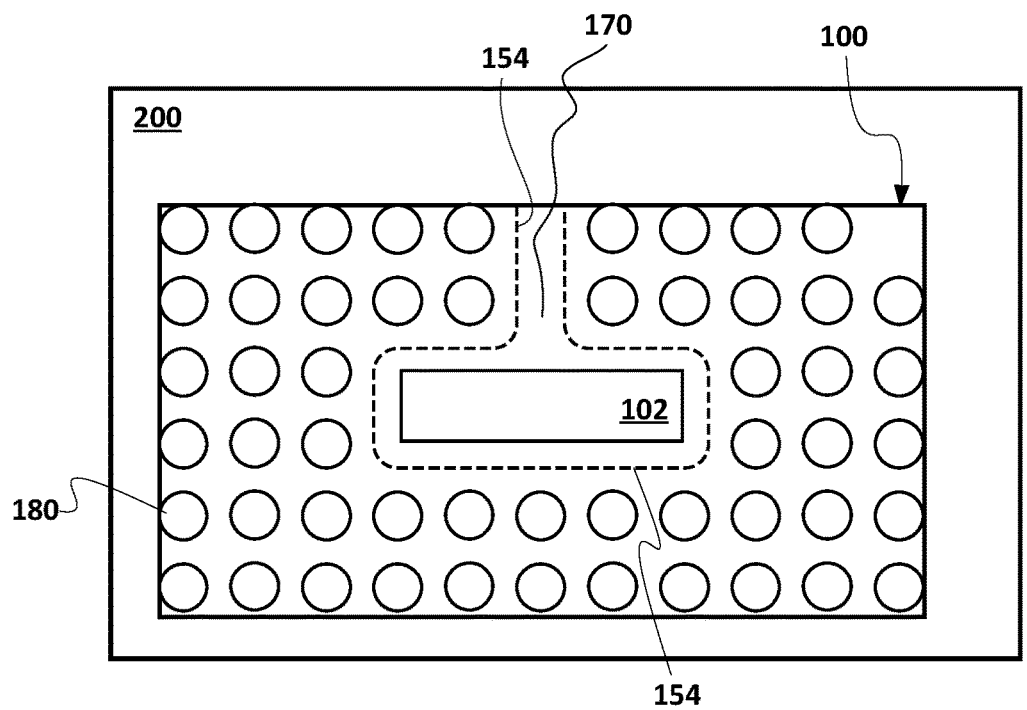
FIGS. 7A and 7B are schematic diagrams illustrating in top plan view cavity venting in accordance with an implementation of the proposed solution.
Figure 7B:
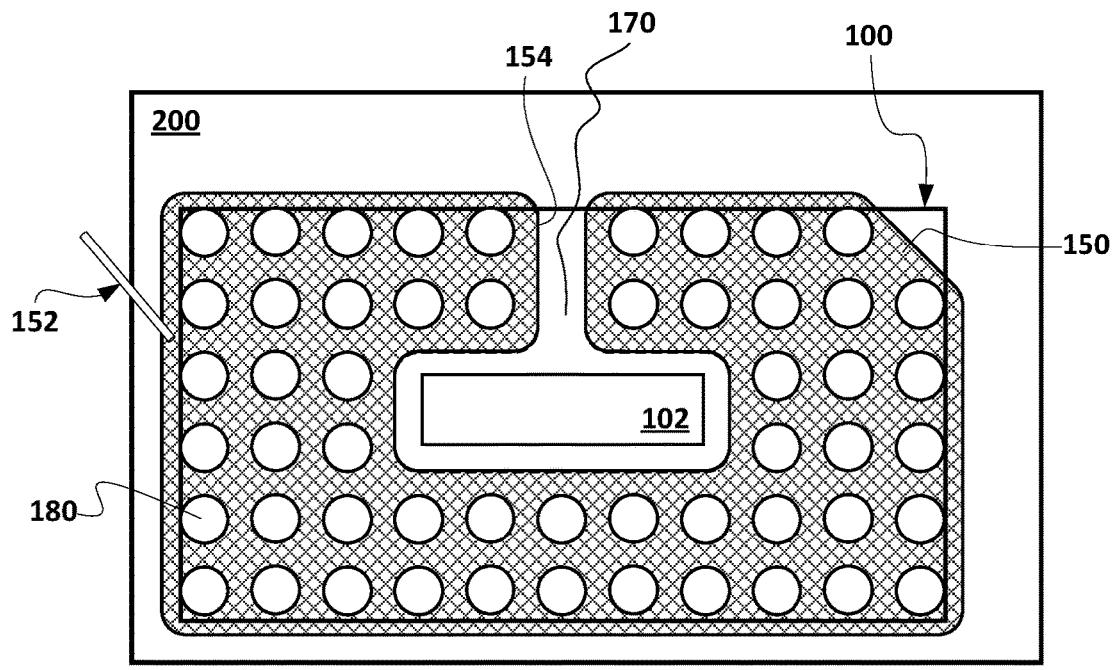

FIGS. 7A and 7B illustrate, in plan view, the vent in the form of a venting trench/channel/tunnel 170 between photonic chip wafer 100 and the substrate 200 by selective topology discontinuity formation (FIG. 7A) wherein the shape thereof is brought out to the edge of the wafer 100. With reference to FIG. 7B, when adhesive underfill material 150 is dispensed between the layers 100, 200, the capillary action and/or surface tension draw the adhesive underfill material 150 outside the sensitive region 102 leaving the vent 170 unfilled.

Figure 8:
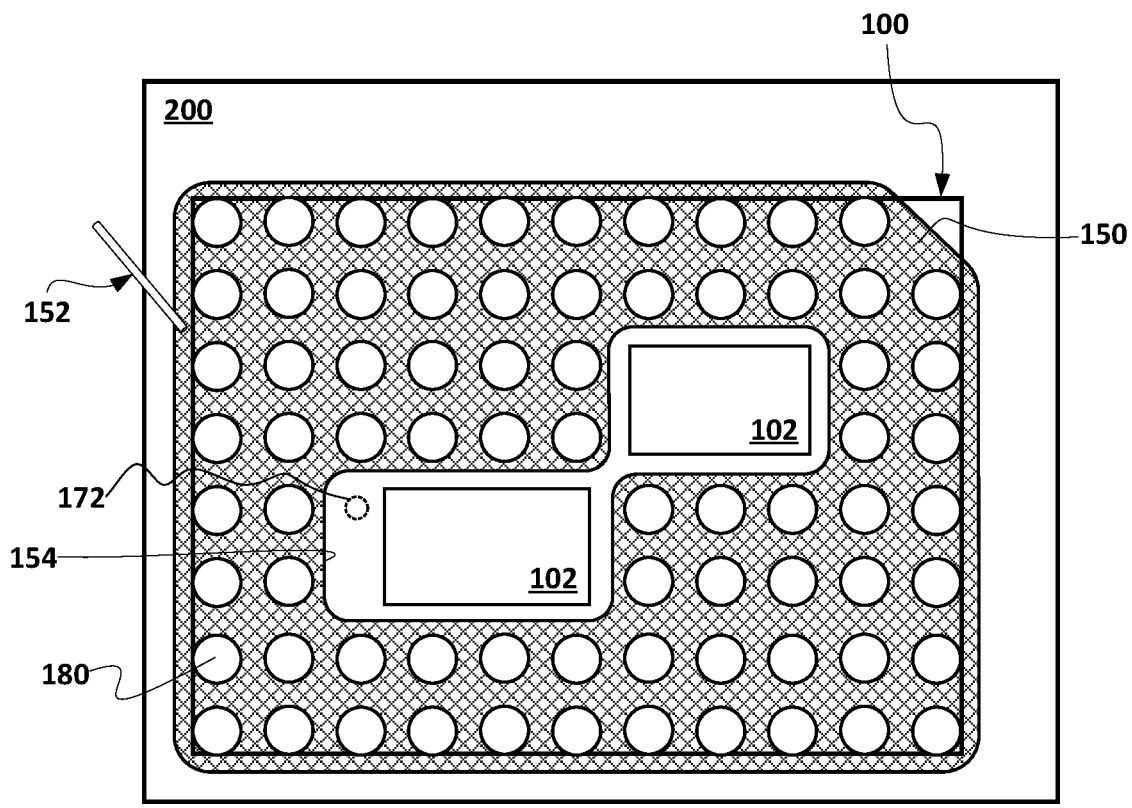
FIG. 8 is another schematic diagram illustrating in top plan view cavity venting in accordance with another implementation of the proposed solution.

In accordance with another implementation of the proposed solution illustrated in FIG. 8, the vent can be provided as a via 172 in the substrate 200. Known methods of providing a via are described elsewhere. Multiple active areas 102 can share the same vent as also illustrated in FIG. 8.

While extensive reference has been made herein to a silicon photonics chip 100, the invention is not limited thereto: the description herein could also apply to other integrated photonics technologies such as, but not limited to: CMOS, SiGE, Indium phosphide, Indium phosphide, Lithium Niobate, Planar Lightwave Circuit (PLC), InGaAs, GaAs and GaAsP substrate, etc. to achieve the similar results.

Figure 9A:
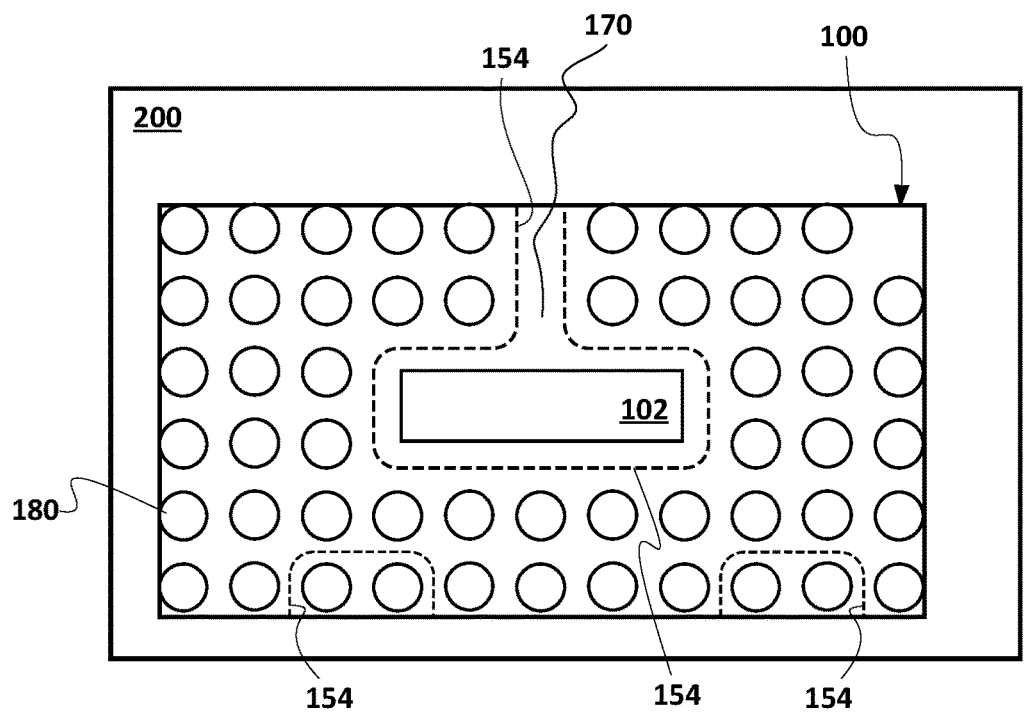
FIGS. 9A and 9B are schematic diagrams illustrating in top plan view formation of adhesive free regions in accordance with another implementation of the proposed solution.
Figure 9B:
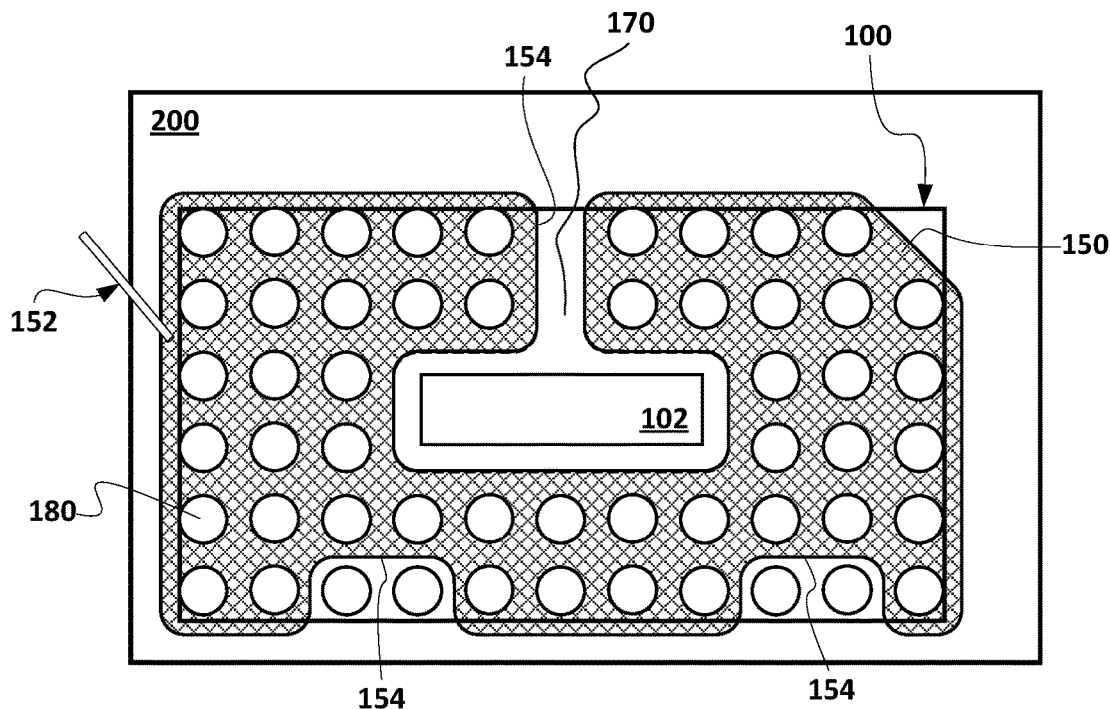

In the above, without limiting the invention thereto, extensive reference has been made to a sensitive circuit region 102 illustrated substantially in the middle of the wafer 100, however no such limitation to the illustrated a mid-chip adhesive free region is implied. Particularly, at least some solder balls providing high speed signaling electrical connectivity would also benefit from being manufactured adhesive free to mitigate parasitic capacitance due to the underfill adhesive material being present in the region adjacent to the solder ball contacts. Any semiconductor/wafer level manufacture technology would benefit from adhesive free regions in sensitive areas around high speed signaling solder ball contacts, including standard CMOS. FIG. 9A illustrates forming topology discontinuities 154 around solder balls associated with signaling connections, for example input signaling solder ball connections and output signaling solder ball connections. FIG. 9B illustrates the spread of underfill adhesive material 150 between the layers 100, 200 providing adhesive free regions under the sensitive IC region 102 and selectively adhesive free regions in sensitive areas about signaling solder balls as guided by corresponding topology discontinuities formed for the purpose. While venting for the adhesive free region under the sensitive region 102 is provided by venting channel 170, no such venting channel is required if for example the solder balls providing electrical connectivity for signaling are located on the edge of the wafer 100, the edge of the wafer 100 exposing the adhesive free sensitive area around the signaling solder balls to external ambient air pressure.

In the above, and without limiting the invention thereto, solely for the ease of description herein, an assumption was made regarding material compatibilities between the adhesive underfill material 150 and the topology discontinuities 154 formed. As described herein above, the most relevant properties of the adhesive underfill material 150 relate to the adhesive underfill material as cured during the operational life of the flip-chip component and include: low material expansion upon curing, low material contraction upon curing, generally low capacitance/inductance, generally high resistance/impedance, high cured adhesive strength, low temperature cycling degradation, etc. Such desired adhesive underfill materials 150 may however have uncured fluid state physical properties incompatible with the topology discontinuity 154 employed, either due to the size or material composition of the topology discontinuity 154 employed or due to insufficient surface tension (or other property) of the fluid adhesive material 150. For example, such desirable adhesive underfill material 150 may not snag (sufficiently) onto the topology discontinuity 154. In accordance with the proposed solution, and with reference to FIGS. 10A to 10D, such desirable adhesive underfill materials 150 can be used with a complementary "negative" underfill 190. Particularly, a complementary non-adhesive underfill material 190 compatible with the topology discontinuity and its formation is employed. A first relevant compatibility with the topology discontinuity 154 includes the non-adhesive underfill 190 having material properties such that, when dispensed between the layers 100, 200, the meniscus of the non-adhesive material 190 will snag onto the topology discontinuity. A second relevant compatibility is immiscibility between the non-adhesive material 190 and the adhesive material 150, such that the meniscus of the non-adhesive underfill material 190 snagged onto the topology discontinuity 154 provides the barrier preventing the adhesive underfill material 150 from interacting with the sensitive region 102 or any desired adhesive free region(s).

Figure 10A:
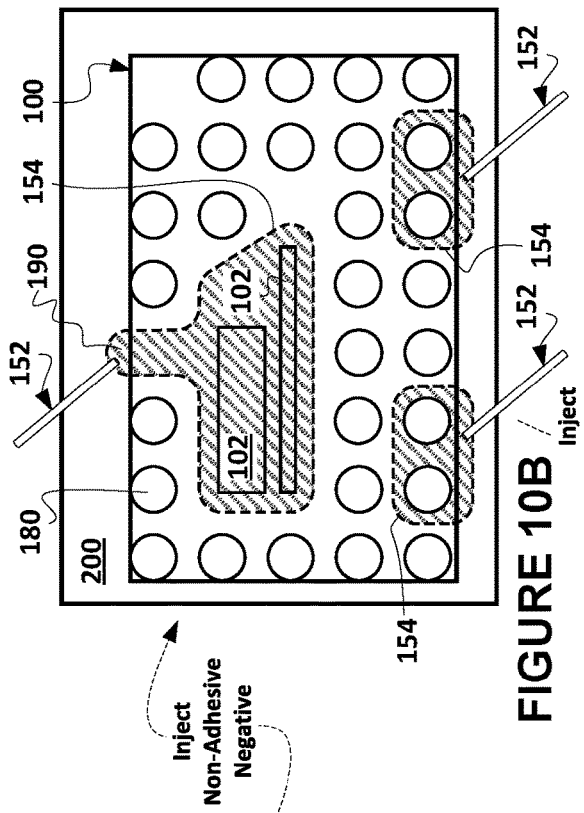
FIGS. 10A, 10B, 10C and 10D are schematic diagrams illustrating in top plan view flip-chip manufacture in accordance with another implementation of the proposed solution, wherein similar features bear similar labels throughout the drawings. While the sequence described can be of significance, reference to "top", "bottom", "over" and "under" qualifiers in the present specification is made solely with reference to the orientation of the drawings as presented in the application and does not imply any absolute spatial orientation.
Figure 10B:
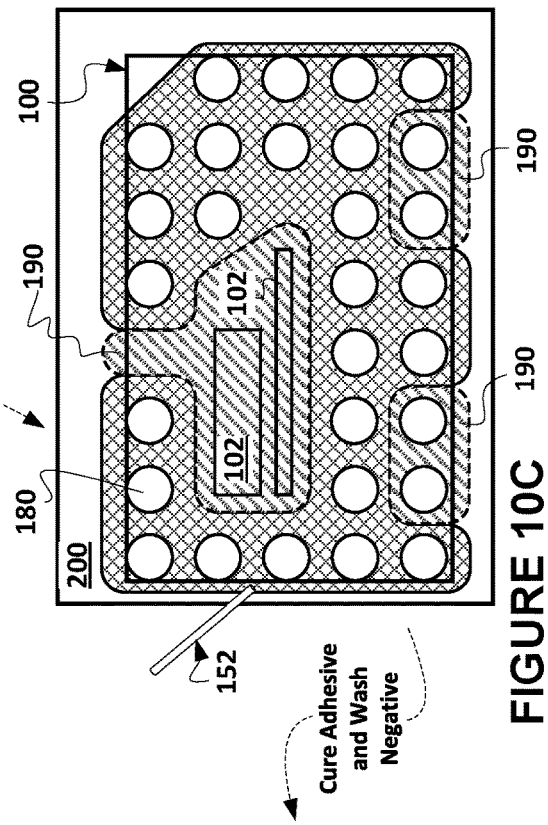
Figure 10D:
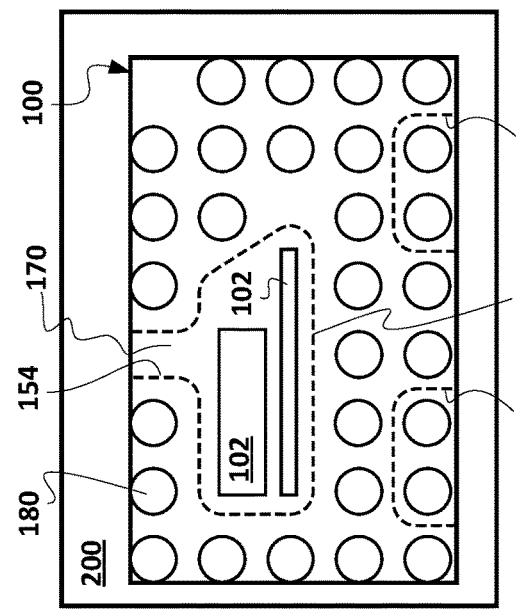
Figure 10C:
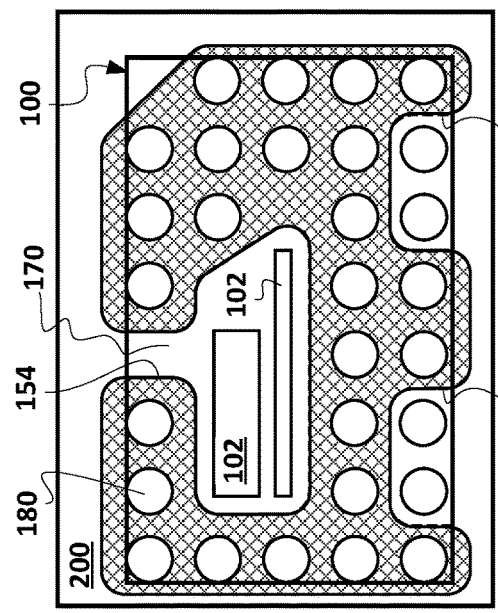

FIG. 10A illustrates selectively providing the topology discontinuities 154 outside sensitive regions 102 and/or a selection of signaling solder balls 180. FIG. 10B illustrates non-adhesive underfill material 190 injected/dispensed/diffused under the sensitive regions 102 and around the selection of signaling solder balls 180 on edge. The non-adhesive underfill material 190 snagged onto the pattern of topology discontinuities 154 provides a negative for the adhesive underfill material 150 subsequently injected/dispensed/diffused as illustrated in FIG. 10C, such that the fluid interface meniscus between the immiscible non-adhesive underfill material 190 and adhesive underfill material 150 prevents the advance of adhesive underfill material 150 into the sensitive regions 102 and into selected areas around signaling solder balls with the adhesive underfill material 150. The adhesive underfill material 150 is cured with the non-adhesive underfill material 190 holding the barrier around the adhesive underfill material 150. Once the adhesive underfill material 150 is cured, the non-adhesive underfill material 190 is washed out to selectively provide the adhesive underfill material free regions as illustrated in FIG. 10D.

For certainty, these and other manufacturing processes are understood to be employed either in sequence or in parallel, or in different sequences than illustrated herein, and conjunction with other manufacturing processes not limited to ones described above.

While the invention has been illustrated and described with reference to preferred embodiments thereof, it will be recognized by those skilled in the art that various changes in form and detail may be made therein without departing from the spirit and scope of the invention as defined by the appended claims.

What is claimed is:

1. A flip-chip structure utilizing two adjacent layers which are a first layer and a second layer, the flip-chip structure comprising:
   one or more electrical connectors providing connectivity between the two adjacent layers;
   a topology discontinuity formed, on a surface of the first layer, outside at least one sensitive region of the flip-chip structure, wherein a height of the topology discontinuity in a direction extending from the surface of the first layer toward the second layer is less than a height of the one or more electrical connectors, and wherein the topology discontinuity is one of a surface variation and a surface roughness of the first layer; and
   adhesive underfill material, between a pair of opposed surfaces of the two adjacent layers, substantially outside the at least one sensitive region due to the topology discontinuity to create a substantially adhesive underfill material-free region.

2. The flip-chip structure as claimed in claim 1, the topology discontinuity being configured to snag a liquid meniscus of the adhesive underfill material.

3. The flip-chip structure as claimed in claim 1, the topology discontinuity being configured to snag a liquid meniscus of a non-adhesive underfill material immiscible with the adhesive underfill material.

4. The flip-chip structure as claimed in claim 1, wherein the substantially adhesive underfill material-free region is vented.

5. The flip-chip structure as claimed in claim 1, wherein a portion of the topology discontinuity extends to an edge of the flip-chip structure and a via in one of the first layer and the second layer is configured to vent the substantially adhesive underfill material-free region.

6. The flip-chip structure as claimed in claim 1, wherein the sensitive region comprises an area around the one or more electrical connectors.

7. The flip-chip structure as claimed in claim 6, wherein the one or more electrical connectors comprise at least one of solder balls, gold ball bumps, gold stud bumps, copper pillars and pads.

8. The flip-chip structure as claimed in claim 1, wherein the two adjacent layers having different coefficients of thermal expansion.

9. The flip-chip structure as claimed in claim 1, wherein the first layer is a silicon photonics chip and the second layer is a substrate of a different technology than the silicon photonics chip.

10. The flip-chip structure as claimed in claim 9, wherein the silicon photonics chip includes high-speed Radio Frequency (RF) circuits which interact with the adhesive underfill material, and wherein the high-speed RF circuits are in the at least one sensitive region.

11. The flip-chip structure as claimed in claim 1, wherein the topology discontinuity is surface roughness provided via one of incomplete sputtering, superficial surface etching, removing an oxide layer of a passivation layer, and scribing.

12. The flip-chip structure as claimed in claim 1, wherein the topology discontinuity is surface roughness that is one or more of discontinuous, dotted, and dashed on the bottom of the first layer.

13. The flip-chip structure as claimed in claim 12, wherein a dimension for the surface roughness is dependent on a surface tension of the adhesive underfill material.

14. A method for providing a flip-chip structure utilizing two adjacent layers which are a first layer and a second layer, the flip-chip structure comprising:
   providing one or more electrical connectors providing connectivity between the two adjacent layers;
   providing a topology discontinuity formed, on a surface of the first layer, outside at least one sensitive region of the flip-chip structure, wherein a height of the topology discontinuity in a direction extending from the surface of the first layer toward the second layer is less than a height of the one ore more electrical connectors, and wherein the topology discontinuity is one of a surface variation and a surface roughness surface of the first layer; and
   providing adhesive underfill material, between a pair of opposed surfaces of the two adjacent layers, substantially outside the at least one sensitive region due to the topology discontinuity to create a substantially adhesive underfill material-free region.

15. The method as claimed in claim 14, the topology discontinuity being configured to snag a liquid meniscus of the adhesive underfill material.

16. The method as claimed in claim 14, the topology discontinuity being configured to snag a liquid meniscus of a non-adhesive underfill material immiscible with the adhesive underfill material.

17. The method as claimed in claim 14, wherein the substantially adhesive underfill material-free region is vented.

18. The method as claimed in claim 14, wherein a portion of the topology discontinuity extends to an edge of the flip-chip structure and a via in one of the first layer and the second layer is configured to vent the substantially adhesive underfill material-free region.

19. The method as claimed in claim 14, wherein the sensitive region comprises an area around the one or more electrical connectors.

\* \* \* \* \*